United States Patent [19]

Miya et al.

[11] Patent Number: 5,398,254
[45] Date of Patent: Mar. 14, 1995

[54] ERROR CORRECTION ENCODING/DECODING METHOD AND APPARATUS THEREFOR

[75] Inventors: Kazuyuki Miya, Machida; Osamu Kato, Yokohama, both of Japan

[73] Assignee: Matsushita Electric Industrial Co., Ltd., Osaka, Japan

[21] Appl. No.: 275,658

[22] Filed: Jul. 15, 1994

Related U.S. Application Data

[63] Continuation of Ser. No. 928,402, Aug. 12, 1992, abandoned.

[30] Foreign Application Priority Data

Aug. 23, 1991 [JP] Japan .................. 3-212286

[51] Int. Cl.⁶ ............... G06F 11/10; H03M 13/12
[52] U.S. Cl. ............................................. 371/43
[58] Field of Search .................... 371/43, 44, 45, 46

[56] References Cited

U.S. PATENT DOCUMENTS

| | | | |
|---|---|---|---|
| 4,748,626 | 5/1988 | Wong | 371/43 |
| 4,802,174 | 1/1989 | Hiraiwa et al. | 371/46 |
| 4,803,729 | 2/1989 | Baker | 381/43 |
| 5,027,374 | 6/1991 | Rossman | 371/43 |
| 5,042,036 | 8/1991 | Fettweis | 371/43 |
| 5,099,499 | 3/1992 | Hammar | 371/43 |
| 5,119,400 | 6/1992 | Kock | 371/43 |
| 5,159,608 | 10/1992 | Falconer et al. | 371/43 |
| 5,185,747 | 2/1993 | Farahati | 371/43 |
| 5,233,630 | 8/1993 | Wolf | 371/43 |
| 5,243,605 | 9/1993 | Lekmine et al. | 371/43 |

FOREIGN PATENT DOCUMENTS 2215232 8/1990 Japan .
92/16065 9/1992 WIPO .

OTHER PUBLICATIONS

N. Seshadri, et al "Generalized Viterbi Algorithms for Error Detection with Convolutional Codes", Globecom 89, Dallas 27.11.89, vol. 3, Nov. 30, 1989, pp. 1534–1538.

Patent Abstracts of Japan, vol. 10, No. 95 (E–395), Apr. 12, 1986 & JP-A-60 237 740 (Mitsubishi Denki K.K.) Nov. 26, 1985.

"Points of Error Correction Encoding Technology," Japan Industrial Technology Center published on Mar. 20, 1986, pp. 45–48.

*Primary Examiner*—Robert W. Beausoliel, Jr.
*Assistant Examiner*—Trinh Tu
*Attorney, Agent, or Firm*—Stevens, Davis, Miller & Mosher

[57] ABSTRACT

The invention provides greater error correction capability in an error correction encoding/decoding system of a digital mobile telephone or so forth. In a viterbi decoding system at a receiver side, a branch metric is calculated and stored without selecting a path with respect to a plurality of branches corresponding to a parameter having a correlation between frames. Also, by utilizing a separately stored parameter value in a previous frame, a transition probability of the parameter value in the current frame is obtained, a metric value of a path is converted and added to an accumulated path metric value up to the previous branch, a comparison of the metric values at various states is performed to select the path having higher likelihood to perform decoding by maximum likelihood decoding.

6 Claims, 4 Drawing Sheets

$a + b + m = n$

| i \ j | 0 | 1 | 2 | 3 | 4 | 5 | 6 | 7 |
|---|---|---|---|---|---|---|---|---|
| 0 | 0.93 | 0.04 | 0.01 | 0.02 | 0.00 | 0.00 | 0.00 | 0.00 |
| 1 | 0.10 | 0.68 | 0.10 | 0.03 | 0.07 | 0.00 | 0.00 | 0.03 |
| 2 | 0.16 | 0.08 | 0.44 | 0.04 | 0.08 | 0.12 | 0.08 | 0.00 |
| 3 | 0.00 | 0.08 | 0.08 | 0.17 | 0.29 | 0.08 | 0.25 | 0.04 |
| 4 | 0.00 | 0.03 | 0.17 | 0.14 | 0.31 | 0.22 | 0.11 | 0.03 |
| 5 | 0.00 | 0.01 | 0.03 | 0.11 | 0.16 | 0.51 | 0.15 | 0.03 |
| 6 | 0.00 | 0.00 | 0.00 | 0.05 | 0.04 | 0.35 | 0.49 | 0.07 |
| 7 | 0.00 | 0.00 | 0.00 | 0.00 | 0.00 | 0.15 | 0.30 | 0.55 |

ERROR CORRECTION ENCODING/DECODING METHOD AND APPARATUS THEREFOR

This application is a continuation of application Ser. No. 07/928,402, filed Aug. 12, 1992 (abandoned).

CROSS-REFERENCE TO RELATED APPLICATION

This application relates to U.S. Ser. No. 07/929,833 filed Aug. 14, 1992 and entitled "Error Correction Encoding/Decoding Apparatus" being filed by Kazuyuki Miya and Osamu Kato, and assigned to the present assignee, based on Japanese Application No. 3-212285 filed on Aug. 23, 1991.

BACKGROUND OF THE INVENTION

The present invention relates to an error correction encoding/decoding method and an apparatus therefor to be employed in radio transmission systems, such as digital mobile telephones, portable telephones and so forth.

In the conventional digital mobile telephone systems or portable telephone systems, a strong error correction encoding is employed in order to maintain a predetermined level of quality even under poor transmission conditions (e.g. high channel error ratio). One of such strong error correction codes is a convolutional code. As a decoding method for the convolutional code, there is viterbi decoding employing a trellis diagram. As disclosed in "Points of Error Correction Encoding Technology", Japan Industrial Technology Center Co., Ltd., published on Mar. 20, 1986, pages 45~48, or Japanese Unexamined Patent Publication (Kokai) No. 2-215232, viterbi decoding is a decoding method, in which one of a plurality of known code streams, having the closest code metric to the received code stream, is selected as a maximum likelihood path, and decoded output data corresponding to the selected path is obtained.

FIG. 1 is a schematic block diagram of an error correction encoding/decoding apparatus employing the conventional viterbi decoding method. For reception data a metric is calculated in a branch metric calculation circuit 21 with respect to each branch (branch line from a certain state to the next state in the trellis diagram) corresponding to each information bit. Then, the branch metric derived by the branch metric calculation circuit 21 is added to a metric of an accumulated path (a sequence of the branches corresponding to the information signal stream) up to the immediately preceding branch stored in a path metric storage circuit 23 by an ACS (Add-Compare-Select) circuit 22. After that, the metrics in each state are compared, and then the maximum likelihood path is selected and stored in a path memory 24 as a path select signal. Also, the value of a path metric is updated and stored in the path metric storage circuit 23. Furthermore, the path metric value is decoded by maximum likelihood decoding by a maximum likelihood decoding circuit 25 and then output as decoded data.

Even with such conventional error correction decoding apparatus as set forth above, bit errors caused in the transmission line can be corrected to a certain precision level by utilizing a redundancy added in convolutional encoding.

However, the conventional error correction encoding/decoding apparatus as set forth above is adapted to only use the redundancy added in the convolutional encoding without using the redundancy of the information source even in the case that the parameter having correlation between consecutive frames is included as a part of information bits to be transmitted so as to have a certain transition probability to define a value in a current frame relative to the value in the previous frame. Therefore, under poor transmission conditions, there is high possibility that correct error correction cannot be performed.

SUMMARY OF THE INVENTION

It is an object of the present invention to provide an error correction encoding/decoding method and a apparatus therefor, which can perform stronger error correction.

In order to accomplish the above-mentioned object, the present invention performs metric calculation at a receiver side with a transition probability of the parameter in addition to a redundancy added upon the convolutional encoding, during viterbi decoding.

Also, according to the present invention, a viterbi decoding system includes storage means for storing transition probability of the parameter which has correlation between consecutive frames in a form of a table, and calculation means for calculating a metric with respect to a sequence of a plurality of branches corresponding to the parameter, in which the metric value is converted with a value derived from the table using a parameter value of the previous frame.

Therefore, according to the present invention, a stronger and more reliable error correction can be realized by utilizing the redundancy of the transition probability of parameter of the information source per se in addition to the redundancy obtained through the convolutional encoding.

DESCRIPTION OF THE PREFERRED EMBODIMENTS

Figure 2:
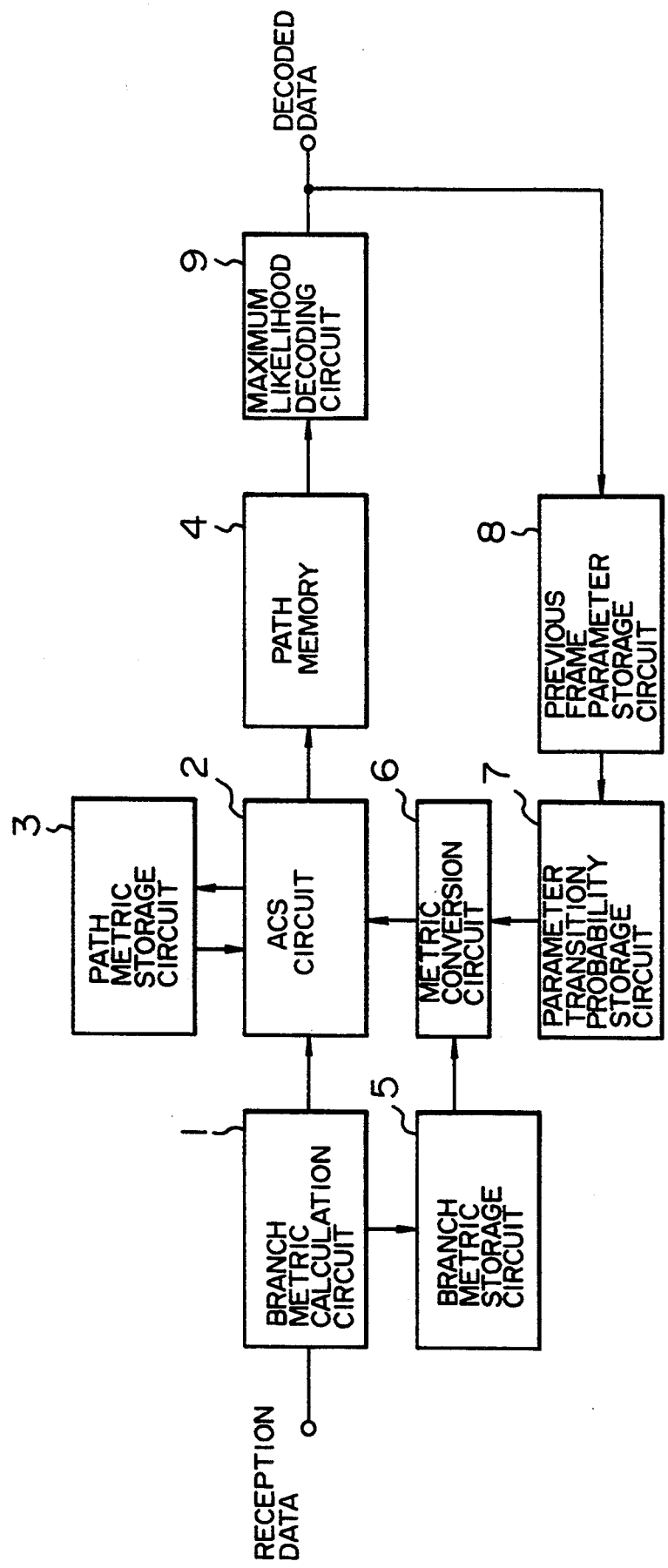
FIG. 2 is a block diagram of a viterbi decoding system in one embodiment of an error correction encoding/decoding apparatus according to the present invention.

FIG. 2 is a schematic block diagram of one embodiment of a viterbi decoding system according to the present invention. In FIG. 2, 2 denotes an ACS (Add-Compare-Select) circuit, 3 denotes a path metric storage circuit, and 4 denotes a path memory (path select signal storage circuit), 5 denotes a branch metric storage circuit, 6 denotes a metric conversion circuit, 7 denotes a parameter transition probability storage circuit and 8 is a previous frame parameter storage circuit.

Figure 1:
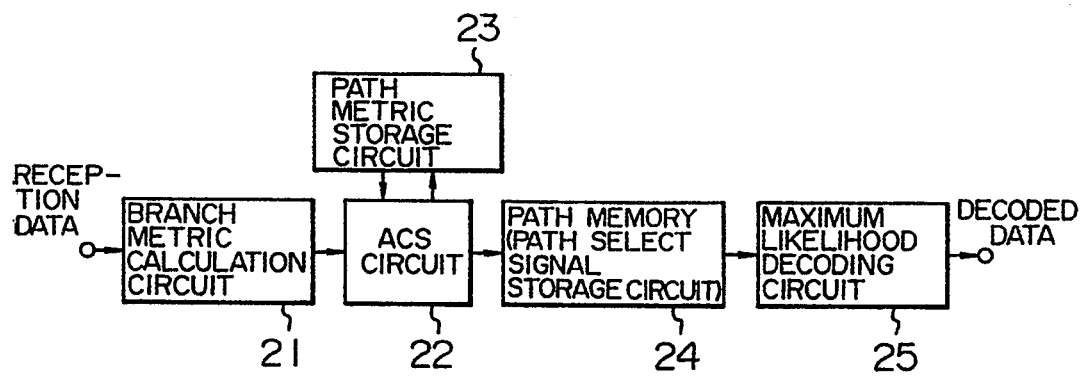
FIG. 1 is a block diagram of a viterbi decoding system in the conventional error correction encoding/decoding apparatus.
Figure 3:
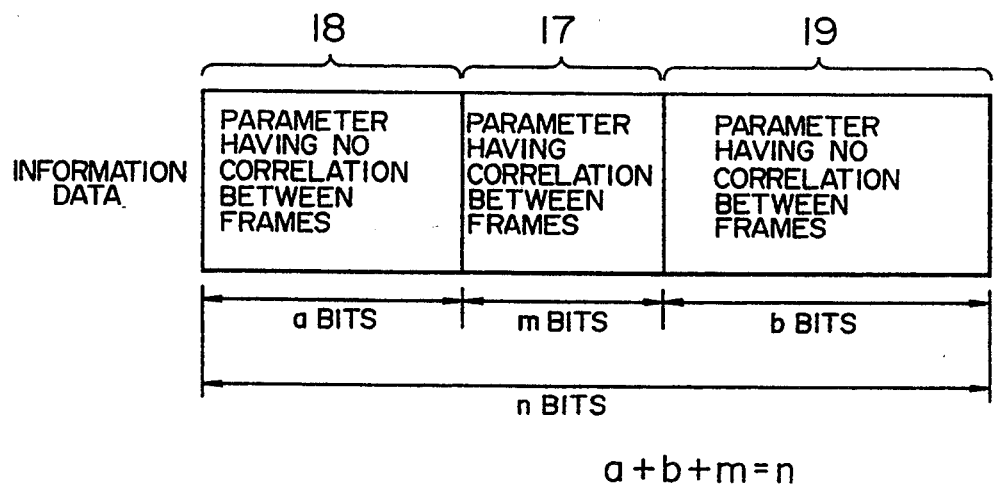
FIG. 3 is an illustration showing an information data structure in the shown apparatus.

On the other hand, FIG. 3 shows an information data structure consisted of n bits per one frame. In FIG. 3, 17 denotes an m bits ($0 \leq m \leq n$) parameter defining correlation between frames in the n bits information data.

This parameter has certain transition probability defining the valve in the current frame relative to the value in the previous frame. Having the transition probability, means that the m bits of the previous frame and the m bits of the current frame are not independently generated information, having an independent relationship to each other and thus the variable of probability of transition to $2^m$ ways of values possibly taken in the next frame relative to the value in the previous frame, and that, namely, the information source is a Markov information source.

Figures 4, 5:
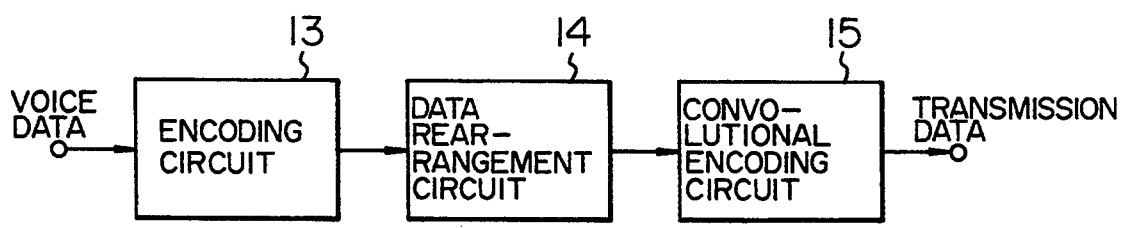
FIG. 4 is a block diagram showing the major part of a encoding system in the shown apparatus.
FIG. 5 is an illustration showing one example of a table to be employed in the shown embodiment.

At the transmitter side, as shown in FIG. 4, voice data is encoded by a encoding circuit 13 by a CELP (Code Excited Linear Prediction) or so forth. Next, in a data rearrangement circuit 14, the parameter 17 is stored in a frame together with the encoded data as set forth above to form the information data. Then, the information data thus formed is encoded by convolutional encoding in a convolutional encoding circuit 15. Then, the encoded data is transmitted as transmission data. Here, parameters 18 and 19, having no correlation between the frames other than the parameter 17, are assumed as a bits and b bits respectively (note, a+b+m=n). At a receiver side, the decoded data is obtained by the viterbi decoding circuit having the construction illustrated in FIG. 2.

Next, operation of the above-mentioned embodiment will be discussed with reference to FIGS. 2 and 3. At first, in the parameter transition probability storage circuit 7, the transition probability of the parameter value of the current frame relative to the parameter value in the previous frame is preliminarily set in the form of a table. In practice, assuming that the value in the previous frame is i, it represents the matrix of the probability p(j, i) to have the value j in the current frame. It should be noted that, in the case set forth above, $0 \leq i$, and $j \leq 2^m - 1$. FIG. 5 shows an example for the case where m=3 bits. On the other hand, the parameter value of the previous frame is constantly stored in the previous frame parameter storage means 8. It should be noted that since the shown system performs decoding processing with respect to each frame, the parameter value stored in the previous parameter storage circuit 8 is updated at every timing when the decoded data is obtained with respect to each frame. On the other hand, in the viterbi decoding, branch metrics are calculated for the branches corresponding to the information bits a and b of the parameters 18 and 19 by the branch metric calculation circuit 1 in the similar manner to the conventional system. Then, in the ACS (Add-Compare-Select) circuit 2, the calculated branch metric is added to an accumulated path metric value up to the previous branch, which is stored in the path metric storage circuit 3 for comparison of the metric values at various states to select the path having the higher likelihood. The selected path is stored in the path memory 4 as a path select signal. Also, the value of the path metric is updated and stored in the path metric storage circuit 3.

On the other hand, in calculation of metric with respect to a sequence of a plurality of branches (m branches) corresponding to the parameter 17, instead of selecting the path for each branch as in the above-mentioned branches, without selecting the path for m branches, the branch metric value is, at first, calculated by the branch metric calculation circuit 1 and the calculated value is stored in the branch metric storage circuit 5. Then, utilizing the parameter value in the previous frame, which is stored in the previous frame parameter storage circuit 8, the transition probability of the parameter value of the current frame is obtained from the transition probability table stored in the parameter transition probability storage circuit 7. Thereafter, the metric values (i.e. partial path metrics) of $2^m$ paths of the length m gathered in various states are converted by the metric conversion circuit 6. Here, assuming that the data to be handled is the encoded data by the encoder having an encoding ratio of $R = \frac{1}{2}$, the metric before conversion is referred to as CR (Channel Redundancy) metric and the metric after conversion is referred to as SCR (Source & Channel Redundancy) metric, conversion is performed with the following conversion equation in the metric conversion circuit 6.

$$\text{SCR metric} = \text{CR metric} \times \log_2\{1/p(j, i)\}/m$$

here, m is the number of bits of the parameter containing the transition probability of p(j, i).

Subsequently, in the ACS circuit 2, the accumulated path metric value up to the previous branch, which is stored in the path metric storage circuit 3, is added to the metric value (SCR metric value) for the m branches after conversion. Comparison of the summed metric values is then performed in various states to select the path having the high likelihood and stored in the path memory 4 as the path select signal. Then, the decoding is performed by a maximum likelihood decoding circuit 9 to output the decoded data.

As set forth above, by the foregoing embodiment, in the case of transmitting the information data including the parameter 17 having correlation between the frames, the parameters 17 is encoded as a continuous data series upon the convolutional encoding. On the other hand, in the viterbi decoding system at the receiver side, there are provided: the branch metric storage circuit 5, the previous frame parameter storage circuit 8 for storing the value of the parameter 17 having the correlation between the frames, in the previous frame, the parameter transition probability storage circuit 7 storing the transition probability of the parameters 17 and the metric conversion circuit 6 performing conversion of the metric. With respect to a plurality of branches corresponding to the parameter 17 having the correlation between the frames, the metric calculation is performed with combining the redundancy of the parameter transition probability of the information source in addition to the redundancy obtained through the convolutional encoding, and selection of the path is performed based thereon. Therefore, the stronger and highly reliable error code correction can be realized.

Figure 6:
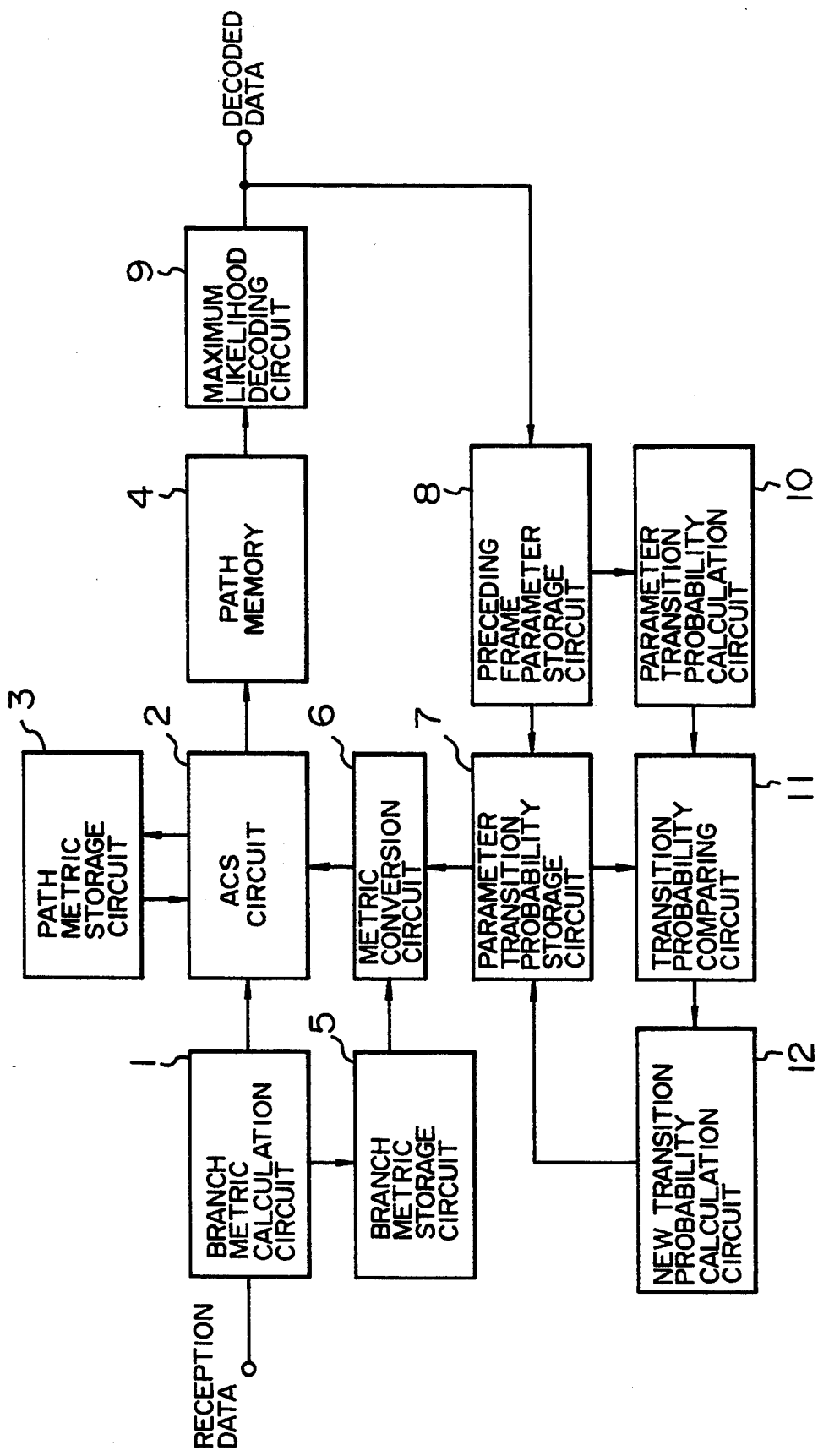
FIG. 6 is a block diagram showing another embodiment of the present invention.

In addition, another embodiment is illustrated in FIG. 6, in which the parameter transition probability storage circuit 7 does not fix the values in the table, and updates the values of the table at a predetermined condition, for instance, when a difference between the parameter transition probability stored in the table and the actual parameter transition probability is maintained greater than or equal to a predetermined value over a given number of frames. It should be noted that the following discussion will be given for the components added to the construction of FIG. 4.

Referring to FIG. 6, a parameter transition probability calculation circuit 10 calculates an actual parameter transition probability on the basis of the parameter value stored in the previous frame parameter storage circuit 8 and the parameter values decoded in further previous cycles. Next, the transition probability comparing circuit 11 compares the transition probability stored in the table, in the parameter transition probability storage circuit 7, with the actual parameter transition probability obtained by the parameter transition probability calculation circuit 10. Here, comparison is performed to determine whether the difference of both probabilities exceeds a specific reference value. At this time, when the difference exceeds the specific reference value, a counter included in the system is counted up and otherwise the counter is reset. The process is performed for every frame. When the difference of both probabilities exceeds the specific reference value over a given number of frames, a new transition probability is calculated by a new transition probability calculating circuit 12 to update the transition probability table of the parameter transition probability storage circuit 7, based on the comparison in the transition probability comparing circuit 11.

As set forth above, by the shown embodiment, by updating the original transition probability table in the decoding side based on the results of decoding during the actual data transmission, the erroneous correction probability can be reduced as a result of proper decoding even when the transition probability of the parameter having correlation, such as voice, is differentiated with respect to each individual.

What is claimed is:

1. In a transmission system for transmitting information in frames, each frame having a plurality of parameters, an error correction encoding/decoding method comprising the steps of:
   (a) at a transmitter side of said transmission system, (i) placing a correlation parameter indicative of a correlation between frames in a fixed part of each frame, (ii) performing a convolutional encoding of the frames, and (iii) transmitting the encoded frames as error correction code;
   (b) at a receiver side of said transmission system, performing Viterbi decoding, including (i) performing calculation of a metric indicating a transitional probability of each branch of a trellis diagram using a first redundancy derived from convolutional encoding for received parameters not having the correlation between frames, (ii) performing calculation of the metric using the first redundancy derived from the convolutional encoding and a second redundancy derived from correlation between frames for received parameters having the correlation between frames.

2. An error correction encoding/decoding apparatus for transmitting information in frames, each frame having a plurality of parameters, said apparatus comprising:
   an encoder comprising:
   encoding means for (i) placing a correlation parameter indicative of a correlation between frames in a fixed part of each frame, (ii) performing a convolutional encoding of the frames, and (iii) transmitting the encoded frames as error correction code; and
   a Viterbi decoder comprising:
   calculation means for (i) calculating a metric indicating a transitional probability of each branch of a trellis diagram using a first redundancy derived from convolutional encoding for received parameters not having the correlation between frames, and (ii) calculating the metric using the first redundancy derived from the convolutional encoding and a second redundancy derived from correlation between frames for received parameters having the correlation between frames.

3. An error correction encoding/decoding apparatus for transmitting information in frames, each frame having a plurality of parameters, said apparatus comprising:
   an encoder comprising:
   encoding means for (i) placing a correlation parameter including a plurality of bits indicative of a correlation between frames in a fixed part of each frame, (ii) performing a convolutional encoding of the frames, and (iii) transmitting the encoded frames as error correction code; and
   a Viterbi decoder comprising:
   transition probability storage means for storing transition probabilities of said correlation parameter with respect to the correlation parameter value of a previous frame;
   previous frame parameter storage means for storing the correlation parameter value of the previous frame;
   branch metric storage means for storing a metric indicating a transitional probability of each branch of a trellis diagram;
   path storage means for storing a selected path of the trellis diagram;
   path metric storage means for storing a path metric indicative of an accumulation of metrics of selected paths; and
   means for (a) determining whether a received bit belongs to said correlation parameter, and (b) if said received parameter bit does not belong to said correlation parameter, then (i) calculating a branch metric for said received bit, (ii) adding the branch metric to the accumulation stored in said path metric storage means, (iii) selecting a path having a greater metric value, (iv) storing the selected path in said path storage means, (v) updating said path metric value in the path metric storage means, and (c) if said received bit belongs to said correlation parameter, then (i) calculating the branch metric for said received bit, (ii) storing the branch metric into said branch metric storage means, (iii) repeating the operations of (c)(i) and (c)(ii) for said plurality of bits belonging to said correlation parameter, (iv) obtaining partial path metrics corresponding to said plurality of bits belonging to said correlation parameter from the branch metrics stored in said branch metric storage means, (v) getting a transition probability of the correlation parameter of a present frame from said transition probability storage means using the correlation parameter of the previous frame, stored in said parameter storage means, (vi) converting the path metrics using the transition probability stored in said transition probability storage means, (vii) adding the converted metric to the accumulation stored in said path metric storage means, (viii) selecting a path having a greater metric value, (ix) storing the selected path in said path storage means, and (x) updating the path metric value of said path metric storage means.

4. An error correction encoding/decoding apparatus as set forth in claim 3, wherein said Viterbi decoder further comprises:
   transition probability calculation means for calculating a transition probability of the correlation parameter from decoded frames;

transition probability comparing means for comparing the transition probability calculated by said transition probability calculation means with a transition probability stored in said transition probability storage means; and new transition probability calculation means for updating said transition probability stored in said transition probability storage means using a predetermined standard and a result of said transition probability comparing means.

5. An error correction encoding/decoding apparatus as set forth in claim 4, wherein said new transition probability calculation means updates the transition probability when a difference between the transition probability derived from the decoded frames and the transition probability stored in said transition probability storage means is continually greater than or equal to a given value over a predetermined number of frames.

6. An error correction encoding/decoding apparatus as set forth in claim 3, wherein said transition probability storage means stores said transitional probabilities of said correlation parameters with respect to the correlation parameter value of a previous frame in table form.

* * * * *